United States Patent
Duennbier

(10) Patent No.: US 12,014,581 B2
(45) Date of Patent: Jun. 18, 2024

(54) METHOD AND DEVICE FOR CREATING AN EMISSIONS MODEL OF AN INTERNAL COMBUSTION ENGINE

(71) Applicant: Robert Bosch GmbH, Stuttgart (DE)

(72) Inventor: Olaf Duennbier, Korb (DE)

(73) Assignee: ROBERT BOSCH GMBH, Stuttgart (DE)

( * ) Notice: Subject to any disclaimer, the term of this patent is extended or adjusted under 35 U.S.C. 154(b) by 329 days.

(21) Appl. No.: 17/454,341

(22) Filed: Nov. 10, 2021

(65) Prior Publication Data

US 2022/0157085 A1 May 19, 2022

(30) Foreign Application Priority Data

Nov. 18, 2020 (DE) .................. 10 2020 214 474.5

(51) Int. Cl.
*G07C 5/00* (2006.01)
*G06F 30/27* (2020.01)

(52) U.S. Cl.
CPC ............ *G07C 5/004* (2013.01); *G06F 30/27* (2020.01)

(58) Field of Classification Search
CPC .. F01N 11/00; F02D 41/0235; F02D 41/1432; F02D 41/1433; F02D 41/1466; F02D 41/1467; F02D 41/2451; F02D 41/1462; F02D 41/1401; F02D 2041/1432; F02D 2041/1433; G06F 30/15; G06F 30/20; G06F 30/27; G07C 5/004; Y02T 10/12
See application file for complete search history.

(56) References Cited

U.S. PATENT DOCUMENTS

| | | | | |
|---|---|---|---|---|
| 2009/0293457 | A1* | 12/2009 | Grichnik | F01N 3/208 701/108 |
| 2010/0251699 | A1 | 10/2010 | Mehendale et al. | |
| 2012/0174653 | A1* | 7/2012 | Ikawa | F01N 9/002 73/23.33 |
| 2018/0168515 | A1* | 6/2018 | Farahmand | A61B 5/725 |
| 2019/0309699 | A1* | 10/2019 | Inoue | F02P 5/15 |

(Continued)

FOREIGN PATENT DOCUMENTS

| | | | | |
|---|---|---|---|---|
| DE | 102006022383 A1 * | 11/2007 | | F01N 11/00 |
| DE | 102008057494 A1 | 7/2009 | | |
| DE | 102017218195 A1 * | 4/2019 | | F01N 3/021 |

(Continued)

OTHER PUBLICATIONS

Machine translation of JP2004316570A (Year: 2004).*

(Continued)

*Primary Examiner* — David P. Merlino
*Assistant Examiner* — Caitlin R McCleary
(74) *Attorney, Agent, or Firm* — NORTON ROSE FULBRIGHT US LLP; Gerard A. Messina

(57) ABSTRACT

A method for creating an emissions model of an internal combustion engine. The method begins with a provision of a plurality of measurement series at an internal combustion engine. There then follows a filtering of the measurement series using various low-pass filters, and ascertaining, from the filtered measurement series, those measurement series, when provided as an input variable for the emissions model during optimization of the emissions model, the smallest deviation from predicted emissions of the emissions model for measured emissions is achieved.

7 Claims, 1 Drawing Sheet

(56) References Cited

U.S. PATENT DOCUMENTS

2019/0370684 A1\* 12/2019 Gunes ................... G06N 20/00
2020/0401743 A1\* 12/2020 Bhattacharyya ..... G01C 21/203

FOREIGN PATENT DOCUMENTS

JP         2004316570 A  \*  11/2004
JP         2005256725 A  \*  9/2005

OTHER PUBLICATIONS

Machine translation of DE102017218195A1 (Year: 2019).\*
Machine translation of JP-2005256725-A (Year: 2005).\*
Machine translation of DE-102006022383-A1 (Year: 2007).\*

\* cited by examiner

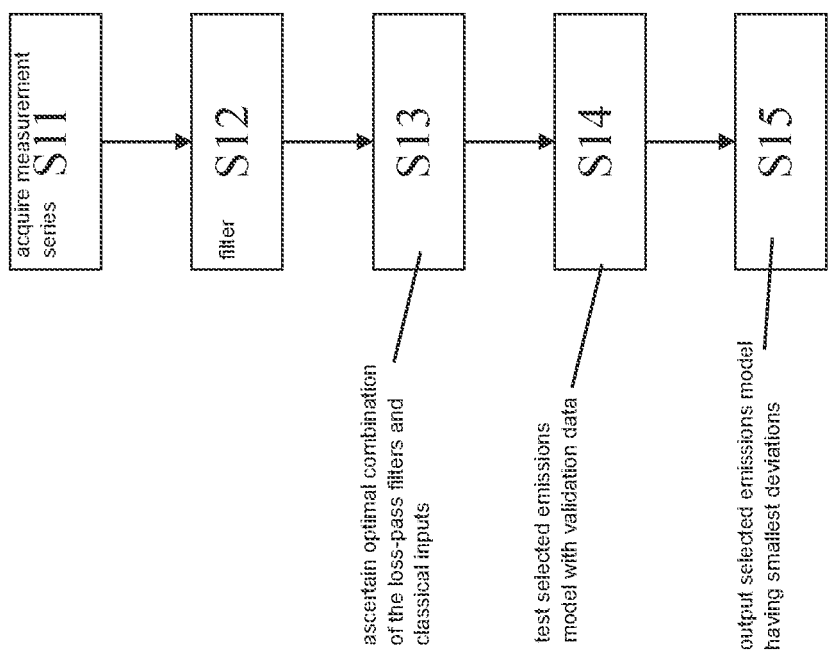

METHOD AND DEVICE FOR CREATING AN EMISSIONS MODEL OF AN INTERNAL COMBUSTION ENGINE

CROSS REFERENCE

The present application claims the benefit under 35 U.S.C. § 119 of German Patent Application No. DE 102020214474.5 filed on Nov. 18, 2020, which is expressly incorporated herein by reference in its entirety.

FIELD

The present invention relates to a method for creating an emissions model of an internal combustion engine using at least one low-pass filter, as well as to a device, a computer program, and a machine-readable storage medium.

BACKGROUND INFORMATION

Some conventional models are used to predict emissions at the outlet of an exhaust pipe. These models are standardly designed in such a way that they predict the emissions of an engine, in particular an internal combustion engine, and, as a function thereof, then predict emissions at the outlet of the exhaust pipe on the basis of a model of the exhaust pipe.

This model for predicting the emissions of the engine is standardly produced by carrying out measurements at different specified operating points of the engine, based on which the model for predicting the emissions is then calculated. This can be done for example using the software ETAS ASCMO.

In addition, conventionally, the model for predicting the emissions can be configured in such a way that the model can take into account a plurality of preceding measurements from the past, in particular measurement series in the form of time series, so that this model can more precisely predict a dynamic behavior of the emissions production of the engine. For this purpose, a so-called feature matrix is used. This matrix contains the information as to which measurement points of the measurement series are to be used for the model prediction. The number of columns of this feature matrix corresponds to the number taken into account of preceding measurement points or time steps, while the number of rows corresponds to a number of the different inputs into the model, e.g., measured measurement variables of the engine. In a processing step in the creation of the model, which can be referred to as "automatic feature selection," the relevant features of the feature matrix are extracted by training and evaluating the model for each combination of the features, using a brute force approach.

The feature matrix mentioned above becomes very large if a high sampling frequency and a long history are required for the model. If the measurements are recorded with a high resolution, e.g., with a sampling frequency of 100 ms, and the maximum time delay is set at for example 3 minutes (=180 seconds), there result 1800 columns. It follows from this that a very large amount of computing time and computing power has to be applied to test all the possible combinations (1800 columns multiplied by the number of different measurement variables of the feature matrix) in the model training, and to reach an adequate model prediction quality.

In addition, in the previous approach, the precise measurement value at the time being considered in the past is taken into account. This is often not necessary. And it increases the noise of the model. In most cases, it is sufficient to take into account the order of magnitude of the measurement value in the past.

SUMMARY

According to an example embodiment of the present invention, a use is proposed of a filter for aggregating past information within the measurement series. From the unfiltered and, optionally, the filtered measurement series, the "automatic feature selection" can determine the best combination of features with respect to the best model quality.

Both the model quality and the model robustness may be significantly improved by this approach. In addition, the calculation time of the automatic feature selection may be drastically reduced.

In accordance with an example embodiment of the present invention, as a consequence, a highly accurate engine emissions model is provided that achieves a particularly high degree of accuracy in the entire operating range of the engine, even under non-stationary conditions. In addition, through the filtering the model also becomes more robust in its predictions, because previously the emissions model was very sensitive due to its looking into the past.

In a first aspect, the present invention relates to a computer-implemented method for creating an emissions model of an internal combustion engine. In accordance with an example embodiment of the present invention, the method includes the following steps:

The method begins with a provision of a plurality of, in particular unfiltered, measurement series acquired at an internal combustion engine. There then follows a filtering of the measurement series with various low-pass filters and an optimization of a plurality of emissions models for combinations, different in each case, of filtered measurement series as input variables for the emissions model, in such a way that a deviation of the predicted emissions of the emissions model for associated acquired emissions for the acquired measurement series is minimized.

There then follows a selection of the emissions model of the plurality of emissions models that achieves the smallest deviation from the predicted emissions of the emissions model for measured emissions. A step can then follow that selects, from the filtered measurement series, those measurement series, when used as input variable for the emissions model during the optimization of the emissions model, a smallest deviation from predicted emissions of the emissions model for measured emissions is achieved.

There then follows an outputting of the optimized emissions model having the smallest deviation, and preferably the filtered measurement series used for this, and respectively assigned low-pass filters that were used for the filtering of the selected filtered measurement series.

The inventors have determined that the exact position of a measurement within a measurement series is not decisive; rather, it is decisive whether a measurement series within recent seconds has a high or low value. Thus, a "vague recollection" of preceding measurements is adequate. Surprisingly, this has also led to the result that the emissions model achieves particularly good predictions even in transition areas.

A measurement series is a sequence of measurement points, in particular sensor values, that were each acquired at a specified time in a sequence of times.

In accordance with an example embodiment of the present invention, it is provided that the various low-pass filters differ in that they have different time constants, e.g., 1 s, 3 s, 5 s, 10 s, 30 s. The time constants define how far one looks into the past, and are taken into account, in particular weighted, in the filtering.

In addition, it is provided that the low-pass filters be first-order. The advantage of this is that an aggregation of the information from the measurement series is concentrated in the filtered signals, so it is no longer necessary to search all preceding times for an ideal combination; rather, only one suitable combination has to be found from the filtered signals.

In addition, it is provided that each acquired measurement series be assigned to a measurement variable, the measurement variable characterizing a variable of the internal combustion engine, in particular characterizing an engine rotational speed, relative cylinder air filling, lambda, ignition angle, cylinder ignition information, the predicted emission being a particle emission, in particular mass and/or number, or a gaseous emission, in particular NOx, THC, CO, and/or temperature/pressure of the emissions.

In addition, in accordance with an example embodiment of the present invention, it is provided that if the low-pass filter is applied to first acquired measurement values and no preceding measurement values are yet available, e.g. when the engine is started, additional fictive measurement values are provided as input variable for the low-pass filter, the additional fictive measurement values characterizing a constant operating point of the engine at low load. The low load is 5 to 40% relative to full load, preferably 20 to 35%. Particularly preferably, for the constant operating point a rotational speed in the vicinity of the idling rotational speed is used as fictive measurement values, e.g. 1000-1900 RPM. That is, fictive measurement values are artificially produced measurement values.

In further aspects, the present invention relates to a device and to a computer program that are each configured to carry out the above methods, and to a machine-readable storage medium on which this computer program is stored.

BRIEF DESCRIPTION OF THE DRAWING

FIG. 1 schematically shows a flow diagram of a specific embodiment of the present invention.

DETAILED DESCRIPTION OF EXAMPLE EMBODIMENTS

FIG. 1 schematically shows a flow diagram of a method (10) for creating an emissions model of an internal combustion engine.

The method (10) begins with step S11. In this step, measurement series of a wide variety of measurement variables are acquired at the internal combustion engine that characterize the internal combustion engine, preferably a state of the internal combustion engine. One of the measurement variables can for example be an engine rotational speed. In addition, the emissions of the internal combustion engine associated with the respectively acquired measurement variables are also acquired as a measurement series. These acquired data are subsequently used as training data.

There then follows step S12. This step can be designated "filtering." In this step, the raw data of the measurement series from step S11 are prepared. In addition to other calculations, they are filtered using a plurality of different low-pass filters. The outputs of the various low-pass filterings are then provided to an optimization software, in addition to the classical inputs. The optimization software is preferably ETAS ASCMO. It is possible that the various low-pass filterings are added to the feature matrix in the form of further rows.

Preferably, the low-pass filters differ in that they filter a different number of measurement points within the measurement series. Particularly preferably, the low-pass filters are first-order low-passes.

Preferably, the low-pass is described by the mathematical equation:

$$out_t = out_{t-1} + (in - out_{t-1}) * dT/T$$

In the next following step S13, using the optimization software an optimal combination of the various low-pass filterings and classical inputs is ascertained, with the result that the emissions model predicts as precisely as possible the likewise associated acquired emissions of the internal combustion engine from step S11. For this purpose, for example the optimization software can combinatorially test which combinations of the different low-pass filtering result in the best emissions model. This can be carried out for example by selecting a combination of the various low-pass filterings and, using these as input variables for the emissions model, optimizing this model, so that a deviation between the predicted emissions of the emissions model and the acquired emissions from step S11 is minimized.

Preferably, the emissions model is a GP-NARX, which is trained for example using supervised learning. Other machine learning systems, and other model types, are also possible. It has turned out that neural networks, in particular RNN, are also particularly suitable.

It is to be noted that the selection of various low-pass filtering and subsequent optimization of the emissions model is carried out multiple times for combinations, different in each case, of the low-pass filtering. Thus, a plurality of emissions models are optimized, each having different input variables.

In a further specific embodiment, in step S13 in addition time constants of the low-pass filter can be optimized using e.g. a genetic algorithm.

From the plurality of optimized emissions models, the emissions model is then selected that achieves the smallest deviation between the predicted emissions of the emissions model and the acquired emissions from step S11.

After step S13, the optional step S14 can be carried out. In this step, the selected emissions model can be tested with validation data. The validation data are further measurement series that were not contained in the training data and are thus used to test the emissions model as to whether the training data were thoroughly learned. If step S14 yields the result that the selected emissions model was not correctly trained, then step S13 can be carried out again. It is possible that this testing with validation data be carried out in step S13 in accordance with specifiable optimization steps.

This selected emissions model, having the smallest deviations, is then outputted in step S15 as the most accurate emissions model. Preferably, in step S15 the associated measurement variables are also outputted whose assigned measurement series were used as input variables for this emissions model. Preferably, in addition instep S15 the associated low-pass filters are also outputted whose filtered measurement series were used as input variables. Preferably also an associated feature matrix.

After step S15 has been carried out, the method (10) ends. The outputted emissions model from step S15 can then be used for various applications. For example, this emissions model can then be used to predict emissions of the internal combustion engine. It is also possible that this emissions model be used for the prediction of emissions at the outlet of an exhaust pipe connected to the internal combustion engine. Here, for example a further model can be used with which the predicted emissions of the engine are then further processed by taking into account physical effects of the exhaust gas system in order to then calculate the emissions at the output of the exhaust gas system.

In the use of the emissions model for the prediction of emissions, measurement series can be acquired that are assigned to the associated outputted measurement variables from step S15 and are filtered with the outputted low-pass filters from step S15, and are then used as input variables for the emissions model.

What is claimed is:

1. A method for creating an emissions model of an internal combustion engine, comprising the following steps:
   providing a plurality of measurement series acquired at an internal combustion engine;
   filtering the measurement series using various low-pass filters;
   optimizing a plurality of emissions models for respectively different combinations of the filtered measurement series as input variables for the emissions models, in such a way that a deviation of a predicted emissions of each emissions model for an acquired measurement series is minimized;
   selecting an optimized emissions model of the plurality of optimized emissions models that achieves a lowest deviation from the predicted emissions of the emissions model for measured emissions; and
   outputting the optimized emissions model having the lowest deviation, wherein the various low-pass filters are first-order low-pass filters,
   wherein, when each low-pass filter is applied to first measurement values, additional fictive measurement values are provided as an input variable for the low-pass filter, the additional fictive measurement values characterizing a constant operating point of the engine at low load.

2. The method as recited in claim 1, wherein the various low-pass filters differ in that they have different time constants relative to one another, the time constant of each respective low-pass filter of the various low pass filters characterizing which preceding measurement values the respective low-pass filter takes into account.

3. The method as recited in claim 1, wherein, during the optimization of the emissions models, at least most recent measurement points of a plurality of the acquired measurement series are taken into account and are used for the input variables.

4. The method as recited in claim 1, wherein each acquired measurement series is assigned to a measurement variable, the measurement variable characterizing a variable of the internal combustion engine, the variable characterizing: an engine rotational speed or relative cylinder air filling or lambda or ignition angle or cylinder ignition information, and wherein the predicted emission is: (i) a particle emission mass and/or number, and/or (ii) a gaseous emission of NOx or THC or CO, and/or (iii) temperature and/or pressure of an emission.

5. A method, comprising:
   creating an emissions model of an internal combustion engine, including:
      providing a plurality of measurement series acquired at an internal combustion engine;
      filtering the measurement series using various low-pass filters;
      optimizing a plurality of emissions models for respectively different combinations of the filtered measurement series as input variables for the emissions models, in such a way that a deviation of a predicted emissions of each emissions model for an acquired measurement series is minimized; and
      selecting an optimized emissions model of the plurality of optimized emissions models that achieves a lowest deviation from predicted emissions of the emissions model for measured emissions;
   using the selected optimized emissions model for predicting emissions of the internal combustion engine or at an outlet of an exhaust pipe that is connected to the internal combustion engine, an acquired measurement series being filtered with a selected low-pass filter and the selected optimized emissions model predicting the emissions of the internal combustion engine as a function of the filtered acquired measurement series as input variables, wherein the various low-pass filters are first-order low-pass filters,
   wherein, when each low-pass filter is applied to first measurement values, additional fictive measurement values are provided as an input variable for the low-pass filter, the additional fictive measurement values characterizing a constant operating point of the engine at low load.

6. A device configured to create an emissions model of an internal combustion engine, the device configured to:
   provide a plurality of measurement series acquired at an internal combustion engine;
   filter the measurement series using various low-pass filters;
   optimize a plurality of emissions models for respectively different combinations of the filtered measurement series as input variables for the emissions models, in such a way that a deviation of a predicted emissions of each emissions model for an acquired measurement series is minimized;
   select an optimized emissions model of the plurality of optimized emissions models that achieves a lowest deviation from predicted emissions of the emissions model for measured emissions; and
   output the optimized emissions model having the lowest deviation, wherein the various low-pass filters are first-order low-pass filters,
   wherein, when each low-pass filter is applied to first measurement values, additional fictive measurement values are provided as an input variable for the low-pass filter, the additional fictive measurement values characterizing a constant operating point of the engine at low load.

7. A non-transitory machine-readable storage medium on which is stored a computer program for creating an emissions model of an internal combustion engine, the computer program, when executed by a computer, causing the computer to perform the following steps:
   providing a plurality of measurement series acquired at an internal combustion engine;
   filtering the measurement series using various low-pass filters;
   optimizing a plurality of emissions models for respectively different combinations of the filtered measurement series as input variables for the emissions models, in such a way that a deviation of a predicted emissions of each emissions model for an acquired measurement series is minimized;

selecting an optimized emissions model of the plurality of optimized emissions models that achieves a lowest deviation from predicted emissions of the emissions model for measured emissions; and outputting the optimized emissions model having the lowest deviation, wherein the various low-pass filters are first-order low-pass filters, wherein, when each low-pass filter is applied to first measurement values, additional fictive measurement values are provided as an input variable for the low-pass filter, the additional fictive measurement values characterizing a constant operating point of the engine at low load.

* * * * *